United States Patent [19]
Davidson et al.

[11] Patent Number: 5,994,033
[45] Date of Patent: Nov. 30, 1999

[54] SCREEN PRINTING STENCIL

[75] Inventors: Robert S. Davidson, London; Stuart J. Palmer, Devon; Julie E. Pratt, Kent; Stephen P. Wilson, Canterbury, all of United Kingdom

[73] Assignee: Sericol Limited, Kent, United Kingdom

[21] Appl. No.: 09/142,021

[22] PCT Filed: Mar. 4, 1997

[86] PCT No.: PCT/GB97/00586

§ 371 Date: Jun. 2, 1999

§ 102(e) Date: Jun. 2, 1999

[87] PCT Pub. No.: WO97/33202

PCT Pub. Date: Sep. 12, 1997

[30] Foreign Application Priority Data

Mar. 4, 1996 [GB] United Kingdom .................. 9604578

[51] Int. Cl.$^6$ .................................. G03F 7/12; C08F 2/46
[52] U.S. Cl. .............................. 430/308; 522/27; 522/28; 522/33; 522/35; 522/44; 522/46; 522/63; 522/149; 525/56; 525/61; 430/270; 430/281; 430/286; 430/287; 524/81; 524/186; 524/233; 524/401

[58] Field of Search ................................. 522/27, 33, 28, 522/35, 44, 46, 63, 149; 525/56, 61; 430/270, 281, 286, 287, 308; 524/81, 186, 233, 401

[56] References Cited

U.S. PATENT DOCUMENTS 4,554,240  11/1985  Schulz et al. .

FOREIGN PATENT DOCUMENTS 786 119   11/1957  United Kingdom .
2 263 699  8/1993  United Kingdom .

Primary Examiner—Samuel A. Acquah
Attorney, Agent, or Firm—Nixon & Vanderhye P.C.

[57] ABSTRACT

A screen printing stencil made from a composition comprising polyhydroxy compounds having a plurality of 1,2- or 1,3-diol groups along a polymer backbone, the diol groups grafted thereto a compound of formula (I) (where A is an arylene or an alkylene group; X is an oxygen atom, a sulfur atom, a carbon-carbon bond, or a group of formula (a), (b) or (c); R is a hydrogen atom or a methyl group; $R^1$ is a ($C_1$–$C_4$) alkyl group; m is an integer of from 1 to 8; n is an integer of from 1 to 3; and p is 1 or 2); or an acetal of the polyhydroxy, compound with ethylene glycol.

18 Claims, No Drawings

SCREEN PRINTING STENCIL

This invention concerns a screen printing stencil.

In screen printing a negative of a print design, known as a stencil, is produced on a mesh, those areas of mesh where printing is not to be effected (stencil areas) being covered with a material impervious to the ink to be used for the printing. Typically the mesh is of a polymer (usually a polyester) or of stainless steel, stretched over a wooden or metal frame.

Many methods have been proposed for the production of screen printing stencils. Stencils can be prepared independently of the screen, by the so-called indirect method, or directly on the screen itself by the so-called direct method.

In the indirect method, a layer of a photosensitive emulsion is coated on to a temporary support sheet, usually a transparent polyester sheet, and the coating is then exposed to actinic light. Thereafter, the layer is developed on the support sheet using water to remove unexposed regions of the photosensitive emulsion. The wet stencil on its support is then adhered to the screen using gentle, even pressure. After drying the stencil, the support sheet is removed, leaving the stencil on the screen mesh ready for printing.

In the direct method, a photosensitive emulsion is coated on to a mesh and dried to give a continuous, even film. A stencil is then produced by imaging the coating directly with a laser, or photographically through a line or half tone positive, the image being developed by removing unexposed areas of the film with water.

A further technique, the so-called capillary film method, involves the application of a photosensitive layer to a polyester sheet which is then transferred to a mesh prior to imaging. Imaging and development are then effected as described for the direct method.

Combinations of emulsions and films are also possible in which a direct emulsion is used to adhere a film to a mesh. Development of the stencil is then effected as with the direct method.

The photosensitive coatings used for all of these techniques are polymer based, and they are formulated to achieve chemical, thermal and mechanical resistance, both in use and during manufacture, dimensional stability, flexibility, maintenance of light stability, and impermeability to liquids.

Hitherto proposed compositions for preparing screen printing stencils are in general based on water soluble colloids, usually polyvinyl alcohols, which act as binder resins. Irradiation of the compositions with actinic light results in their becoming insoluble in water so that they remain on the screen after development, while areas protected from actinic light retain their water solubility and are easily washed away with water.

Image development with water requires the coatings of the water soluble colloids to be rendered insoluble to water as a consequence of exposure to actinic light. This can be achieved either by crosslinking the colloid or by forming a secondary polymer matrix within the coating structure, thereby preventing redispersion in the water used for development.

Crosslinking can be achieved by a number of methods using ultra-violet or visible radiation. In one method, colloidal polymer molecules having reactive groups along the polymer chain can cross-link with other polymer molecules via the reactive groups. Alternatively, some reactive groups require an intermediate crosslinking agent. In either case, the resultant increase in molecular weight of the colloid reduces its solubility in water.

Secondary polymer matrices can also be formed by dispersing photopolymerizable monomers and/or oligomers in the aqueous colloidal solution.

Desirable properties for colloidal binder resins for producing screen printing stencils are solvent resistance, decoatability and water solubility. Polyvinyl alcohol derivatives meet all of these requirements, as well as having good mechanical strength and heat resistance. Furthermore, decoating of insolubilized polyvinyl alcohol based coatings can be simply achieved by selectively oxidising the 1,2-diol groups on the polymer chain, for example by applying a solution of sodium metaperiodate.

Polyvinyl alcohols are in general produced by the hydrolysis of polyvinyl acetate, and their water solubility is related both to their molecular weight and to the degree of hydrolysis of the polyvinyl acetate. In general, water solubility requires at least 70% of the acetate groups of the precursor polyvinyl acetate to have been hydrolysed to hydroxy groups. However, totally hydrolysed polyvinyl alcohols are usually only slightly soluble in cold water as a result of strong intermolecular hydrogen bonding. Lower molecular weight polyvinyl alcohols tend to be more soluble in water than higher molecular weight grades.

The use of polyvinyl alcohol in photocrosslinkable compositions for producing screen printing stencils is well known in the art. Early compositions were photosensitized by adding a dichromate or a polymeric diazonium salt, the polyvinyl alcohol and the sensitizer usually having to be supplied in separate packs. After mixing, the compositions have a limited useful pot-life, for example of up to three months, longer periods under conditions of normal temperature and humidity resulting in the components reacting and becoming insoluble in water before exposure to light. Similarly, coated screens produced from these compositions have a limited useful shelf life. Furthermore, chromium compounds are undesirable due to their toxicity.

Improved photosensitive compositions can be produced by reacting polyvinyl alcohol with a compound having a photocrosslinkable group. U.S. Pat. No. 2,610,120 describes photocrosslinking of cinnamoyl esters of polyvinyl alcohol. However, water developability is hindered by high levels of replacement of hydroxyl by cinnamoyl groups, and such systems do not make practical stencil emulsions.

EP0092901-A describes polyvinyl alcohol derivatives with pendent chalcone groups as photocrosslinkable groups. The structures of the pendent groups can easily be varied in order to match the spectral characteristics of the light source used for exposure. However, the rate of crosslinking of such derivatives is slow.

An improved method of effecting crosslinking of polyvinyl alcohol is described in GB2030575-A, pendent styryl pyridinium groups on the polyvinyl alcohol dimerizing under the influence of actinic light. The resultant increase in the molecular weight of the polymer renders coatings of the polymer insoluble in water. Grafting of pendent styryl pyridinium groups on to polyvinyl alcohol can be readily effected in aqueous solution.

Due to the low levels of grafting with styryl pyridinium groups required for efficient crosslinking of the polyvinyl alcohol, these photocrosslinkable polyvinyl alcohol derivatives retain their water solubility and contain sufficient 1,2-diol groups to be decoatable with periodate. However, the chromophore of the pendent styryl pyridinium groups cannot be easily tuned to optimise absorption of light from a variety of light sources. Furthermore, compositions using such derivatives have exhibited poor adhesion to the mesh. Each photon absorbed by the pendent chromophore can only cause dimerization of one pair of pendent styryl pyridinium groups. The ultimate quantum yield of cross-linkages is therefore less than for a comparable free-radical initiated photopolymerization process.

A secondary polymer matrix which is insoluble in water can be formed by photopolymerizing compositions containing photopolymerizable monomers and/or oligomers possessing light sensitive groups, or to which a photoinitiator system has been added. Oligomers are preferred because the rate of insolubilization of the compositions on exposure is usually more rapid, presumably due to a rapid establishment of a network polymer structure and also because of their lower rate of evaporation on drying. Their outstanding performance as low molecular weight addition polymerizable components is due to a plurality of addition polymerizable linkages, terminal linkages being particularly reactive. Examples of such monomers and oligomers include ethylenically unsaturated monomers and oligomers, and epoxides.

GB2137626-A describes the insolubilization of polyvinyl alcohol containing dispersed cationically curable epoxy resins which are crosslinked by a photogenerated acid. However, the cure rate of such resins is slow.

GB2109392-A describes the insolubilization of polyvinyl alcohol containing multifunctional ethylenically unsaturated prepolymers which have been solubilized by the addition of high boiling solvents and surfactants. In neither of such systems does the polyvinyl alcohol form a network, so the resultant matrix cannot be readily cleaved with periodate.

U.S. Pat. No. 4,272,611 describes acrylate-containing compositions with improved processability. It is proposed that clear homogeneous solutions can be achieved using water-soluble polyvinyl alcohol polymers containing 5 to 75% by weight of oxyethylene units. The alleged advantage of such compositions is the ability to use monomers and oligomers which would be classified as incompatible in conventional compositions.

It is desirable with such compositions which contain dispersed acrylates, for the polyvinyl alcohol derivative to participate in the crosslinking of the coating. For example, when photosensitive polyvinyl alcohol as described in GB2030575-A, is used in such coatings cleavable groups are introduced into the crosslinked network, and the coating can later be decoated with a periodate. These systems highlight the desirability for the polyvinyl alcohol to take an active part in the insolubilization process.

U.S. Pat. No. 4,554,240 describes the grafting of acrylic crosslinkable groups on to polyvinyl alcohol through ester linkages. The resultant polymerizable resins replace both the binder and the crosslinkable groups of hitherto proposed compositions. However, aqueous solutions of these resins are not always stable at room temperature.

U.S. Pat. No. 4,621,044 describes liquid coating compositions consisting of a photosensitive oligomer dispersed in a polyvinyl alcohol solution containing a glycidyl (meth) acrylate, the glycidyl groups reacting in aqueous ethanol with terminal groups of the polyvinyl alcohol. In use, most of the insolubility must be derived from the secondary polymer matrix, the latter having the disadvantage of poor decoatability. Furthermore, any unreacted glycidyl acrylate will render the composition toxic and impair the efficiency of the photopolymerisation.

According to the present invention there is provided a screen printing stencil made from a composition comprising polyhydroxy compounds having a plurality of 1,2- or 1,3- diol groups along a polymer backbone, the diol groups having grafted thereto a compound of formula I below

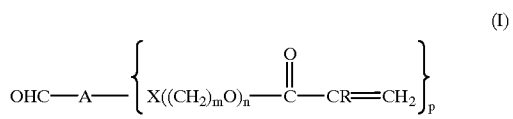

(where A is an arylene or an alkylene group;

X is an oxygen atom, a sulfur atom, a carbon-carbon bond, or a group of formula

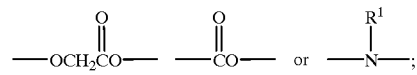

R is a hydrogen atom or a methyl group;
$R^1$ is a $(C_1-C_4)$ alkyl group;
m is an integer of from 1 to 8, preferably from 1 to 6;
n is an integer of from 1 to 3; and
p is 1 or 2); or an acetal of the polyhydroxy compound with ethylene glycol.

In formula I, A is preferably a benzene ring which can be substituted in the 1,2-, 1,3- or 1,4-positions when p is 1, a benzene ring substituted in the 1- and 4-positions being particularly preferred. The group A can, for example, represent an alkylene group of formula —$CH_2CH(CH_3)$—.

The compounds of formula I can be produced by known methods, for example by esterifying the appropriate alcohol with acrylic or methacrylic acid, or a functional derivative of such acids.

The preferred polyhydroxy compound is polyvinyl alcohol, but other polyhydroxy compounds can have a compound of formula I grafted thereto, for example cellulose and hydroxyalkyl derivatives thereof, e.g. hydroxyethyl cellulose, hydroxypropyl cellulose and ethyl-hydroxyethyl cellulose. The polyhydroxy compounds can be used in combination with a free radical photoinitiator and/or a photochemical crosslinking agent.

Grafted polyvinyl alcohol derivatives of the present invention can be readily prepared in homogeneous aqueous solution without the hazards associated with the use of organic solvents, for example of the type described in U.S. Pat. No. 4,554,240 and U.S. Pat. No. 4,621,044 for the preparation of prior art grafted polyvinyl alcohols. Furthermore, compositions of the present invention have the advantages that grafted polyvinyl alcohols in accordance with the present invention are often soluble in aqueous media, combined with being highly sensitive to becoming insolubilized following exposure to actinic light. In addition, the photocured compositions can be readily removed from stencil meshes by treatment with periodate. Thus, photoinsolubilized stencils can be easily prepared, and they are both water developable and readily decoatable using known techniques.

The grafted polyvinyl alcohol derivatives of the present invention are preferably prepared in a water-based homogeneous system in which both a compound of formula I and the polyvinyl alcohol are dissolved. The water may, if desired, contain a solubilizing agent, such as a water miscible solvent, and a surfactant. Grafting of the unsaturated aldehyde on to the polyvinyl alcohol is preferably effected under acidic conditions, for example, as described in GB2030575-A.

It is generally preferred that up to 20 percent of the hydroxy groups of the polyhydroxy compound have a compound of formula I grafted thereto, and more preferably from 0.2 to 10 percent thereof.

The preferred polyvinyl alcohols for use in accordance with the present invention have an average degree of polymerization of from 350 to 2500. The degree of hydrolysis of the polyvinyl alcohol, which will in general be a product of the hydrolysis of polyvinyl acetate, is preferably from 75 to 99 percent.

Mixtures of more than one type of polyhydroxy compound, and in particular more than one type of polyvinyl alcohol can also be used.

The polyhydroxy compounds can, if desired, have other photoreactive or photostable aldehydes grafted thereto, in addition to compounds of formula I.

Compositions of the present invention can contain up to 95 and preferably contain from 20 to 50 percent by weight of the grafted polyhydroxy compound based on the total weight of solids in the compositions.

In general, the solubility in aqueous media of grafted polyhydroxy compounds in accordance with the invention falls as the degree of grafting increases. However, the aqueous solubility of grafted polyhydroxy compounds in accordance with the present invention, and polyvinyl alcohols in particular, can be increased by grafting hydrophilic groups on to the polymer backbone, or by the inclusion of a solubilizer in the compositions. Suitable solubilizers can be selected from a wide variety of solvents and surfactants, provided they are also compatible with other components of the compositions. However, it is generally preferred to use grafted polyvinyl alcohols or other grafted polyhydroxy compounds in accordance with the present invention which are themselves inherently soluble in aqueous media.

Unlike many hitherto proposed compositions for making stencils, which often include a cationic photosensitive groups for insolubilizing polyvinyl alcohol, the present invention uses non-cationic photosensitive groups which can improve their compatibility with a wider range of solubilizers.

Protic water-soluble solvents can be used as solubilizers, for example alcohols, e.g. benzyl alcohol, ethylene glycol or propanol, or amines. Aprotic solvents, e.g. dimethyl formamide, N-methylpyrrolidone, triethylamine or dimethylsulphoxide, can also be used.

It is preferred that the solubilizer which is used does not evaporate significantly during processing to form stencils, this tending to improve the stability of compositions. The incorporation of small percentages of such solvents has not been found to have a significant effect on the drying time of coatings of the compositions. Solubilization of the grafted polymers can also be effected by the inclusion of a plasticizer, e.g. di-butyl phthalate.

Preferred surfactants for use as solubilizers have a hydrophilic portion derived from a hydrocarbon and a hydrophilic portion which can be a charged, including zwitterionic groups, or can be a neutral group which is itself polar. Examples of surfactants which can be used include cetyl trimethylammonium bromide, potassium salts of ethoxylated alkyl phenol phosphate esters and polyethylene glycol ethers and esters.

The photoinitiator can be selected from those proposed hitherto for the free radical polymerization of unsaturated compounds by exposure to actinic light. Preferred photoinitiators include thioxanthone derivatives, substituted benzophenones, e.g. 4-benzoyl-benzyl trimethylammonium chloride, substituted benzils, e.g. sodium 4-(sulfomethyl)-benzil, acyl phosphine oxides, and mixtures thereof. Particularly preferred photoinitiators are thioxanthones, eg 2-hydroxy-3-(3,4-dimethyl-9-oxo-9H-thioxanthen-2-yloxy)-N,N,N-trimethyl-1-propanaminium chloride, 2-hydroxy-3-(1-methyl-9-oxo-9H-thioxanthen-4-yloxy)-N,N,N-trimethyl-1-propanaminium chloride, and anionic derivatives of the type described in GB2108979-A, e.g. the sodium salt of 2-(3-sulphopropoxy)-thioxanthenone.

The photosensitivity of the compositions can be further increased by the inclusion of an accelerator, e.g. a tertiary amine. Preferred accelerators are tertiary amines containing at least one group derived from an aliphatic alcohol, e.g. N-methyldiethanolamine or ethyl 4-dimethylaminobenzoate.

Other crosslinking agents for polyvinyl alcohol, e.g. diazonium salts, can also be included to increase the water resistance of the stencils. The amounts of these materials which are included, in the compositions should be carefully chosen to avoid adverse interference with the photopolymerization of grafted groups derived from the compounds of formula I.

The grafted polyhydroxy compounds generally serve as a binder for other materials present in the compositions of the present invention. Other materials which act as light sensitive binders can also be included, for example polyvinyl alcohol having grafted styryl-pyridinium groups.

Other materials which can be included in the compositions include fillers or extenders to increase their solids content, and other additives which improve the performance of the compositions. Fillers or extenders can be used to increase the thickness or build of the stencils. Such fillers or extenders can be inert, film-formable, or photopolymerizable in their own right. Suitable inert fillers include starch, kaolin, polytetrafluoroethylene, titanium dioxide and silica.

Hydrophobic polymers can also be included in the compositions, for example in the form of aqueous dispersions solubilized by a surfactant or by a water soluble colloid. Polyvinyl alcohol is particularly preferred as the water soluble colloid. These dispersions can often form a cohesive film when dry, thereby binding fillers and pigments, and also promoting their adhesion to the screen meshes. In addition, polymer dispersions can be produced with high solids contents, e.g. up to 60 percent by weight, without imparting an excessively high viscosity to the compositions. This can enable improved compositions to be prepared. Examples of polymer dispersions which can be used include those of polyvinyl acetate, vinyl acetate/ethylene copolymers, vinyl acetate/acrylic ester copolymers and styrene/butadiene copolymers.

Other photopolymerizable materials can, if desired, be included in the compositions, for example, materials which can be copolymerized with the grafted polyhydroxy compounds and/or which can be photopolymerized to produce a secondary matrix in addition to that formed by photopolymerization of the grafted polyhydroxy compounds. The secondary matrix serves to enhance the physical properties of the photopolymerized compositions. Materials used to form a secondary matrix should be selected carefully to avoid losing the advantages of the polyhydroxy compounds.

Such photopolymerizable hydrophobic or hydrophilic compounds can be dissolved or dispersed in compositions of the present invention. Hydrophobic and sparingly soluble compounds can be used as solutions in a solvent which is compatible with the grafted polyhydroxy compound.

The inclusion of compounds having at least two photocrosslinkable groups, e.g. pentaerythritol triacrylate, pentaerythritol trimethacrylate, pentaerythritol tetracrylate, trimethylolpropane triacrylate, tripropyleneglycol diacrylate and triethyleneglycol diacrylate, is generally preferred in order to obtain crosslinked products with particularly good solvent resistance. It is also preferred to include non-volatile acrylate oligomers which are retained in the coating during the drying procedure.

Hydrophilic unsaturated compounds which can be used include those having an affinity for the polyhydroxy compound. In the case of grafted polyvinyl alcohol, they can also serve to provide a continuous polyvinyl alcohol phase in the compositions. Examples of such materials include N-vinylpyrrolidone, polyethylene glycol 200 diacrylate, and Lankro RCP 2685, 2701, 2785 and 2850 (water dilutable UV curable acrylate resins).

Polyfunctional acrylate and methacrylate oligomers described in U.S. Pat. No. 4,621,044 can also be included in the compositions, the grafted polyvinyl alcohols in general being compatible with such oligomers over a much wider range of concentrations than are the polymers described in U.S. Pat. No. 4,621,044. Furthermore, these oligomers can impart improved toughness or flexibility to the cured compositions.

The compositions can also contain emulsion stabilizers, wetting agents, defoaming agents and/or plasticizers to improve their overall performance. In addition it is usually preferred to include an inhibitor of thermal polymerization. Furthermore, dyes or pigments can be included to provide visible stencils.

The following Examples are given by way of illustration only. All parts are by weight unless otherwise indicated.

EXAMPLE 1

4-Hydroxybenzaldehyde (33.8 parts) was dissolved, with mechanical stirring, in a solution of sodium hydroxide (12.4 parts) in water (124 parts), and 2-chloroethanol (20.8 parts) were then added with continued stirring. The mixture was heated to 115° C. and maintained at this temperature for 20 hours after which the mixture was allowed to cool to room temperature.

A 10% w/w aqueous sodium hydroxide solution (75 parts) was added, and the mixture was extracted with two successive portions of ethyl acetate (each 200 parts). The extracts were combined and washed with two successive portions of saturated sodium chloride solution (each 100 parts), following which the extracts were dried over anhydrous sodium sulfate solution and filtered.

The filtrate was evaporated under reduced pressure to leave an oil which became a yellow solid when stored below 5° C. Traces of oil were removed by washing the solid with hexane (100 parts) followed by air drying, which left the desired 2-(4-formyl-phenoxy)ethanol (20.4 parts).

The solid 2-(4-formylphenoxy)ethanol produced (20 parts) was dissolved in tetrahydrofuran (200 parts) and stirred in a flask which was cooled in ice and was fifted with a drying tube.

Triethylamine (25.1 parts) was added, followed by a solution of acryloyl chloride (14.7 parts) in tetrahydrofuran (50 parts) which was added dropwise over a period of two hours. The reaction mixture was then stirred at room temperature for 20 hours.

Water (100 parts) was added, and the mixture was extracted with two successive portions of dichloromethane (each 100 parts). The extracts were combined and washed successively with water (100 parts), saturated sodium hydrogen carbonate solution (100 parts) and water (100 parts). Thereafter they were dried over anhydrous magnesium sulfate, the drying agent was filtered off, and the extracts were evaporated under reduced pressure to leave an oil which solidified when stored below 5° C. The solid was recrystallized by dissolving it in the minimum volume of toluene at 70° C. followed by the addition of an equal volume of hexane at a temperature of 70° C. A solid was formed on cooling the mixture to below 50° C. This solid, which was filtered off, washed with hexane (10 parts), and air dried, was 4-(2-acryloyl-oxyethoxy)benzaldehyde (11.3 parts).

EXAMPLE 2

4-(2-Acryloyloxyethoxy)benzaldehyde produced as in Example 1 (0.61 parts) was stirred into a 13% aqueous solution of polyvinyl alcohol (88% hydrolysed, degree of polymerization 2600-20 parts). 4-Toluene sulfonic acid (0.08 parts in water, 2 parts) was added after 1 hour of stirring, and stirring of the mixture was continued for a further 2 hours.

The mixture was then left to stand overnight before being neutralized using a weakly basic anion-exchange resin (0.4 parts). The resin was removed by filtration.

EXAMPLE 3

The acetalized polyvinyl alcohol solution produced in Example 2 (104 parts) was blended with 2-hydroxy-3-(3,4-dimethyl-9-oxo-9H-thioxanthen-2-yloxy)-N,N,N-trimethyl-1-propanaminium chloride (1 part) dissolved in water (8.3 parts), 2-n-butoxyethyl 4-(dimethylamino)benzoate (1.7 parts), N-vinyl-2-pyrrolidone (3.3 parts), polyethylene glycol 400 (5.7 parts) and Unisperse Blue GE (90%)(0.1 part, ex Hoechst). The resultant mixture was coated on to a screen mesh (120 threads per cm), dried and exposed for 20 light units through a photographic positive in a NuArc FT26V3UP flip-top exposure unit. After washing the mesh with water to remove uncured coating material, a relief stencil image was obtained.

EXAMPLE 4

A solution of an 88% hydrolysed polyvinyl alcohol (Airvol 540, ex Air Products—9.75 parts) in water (73 parts) was reacted with a solution of 4-(2-acryloyloxyethoxy) benzaldehyde produced as in Example 1 (0.75 parts) in N-methylpyrrolidone (3.75 parts) using 4-toluenesulfonic acid (0.3 parts) as a catalyst, using the method described in Example 2. After neutralization the solution was used in the following composition:

| | |
|---|---|
| Acetalized Airvol 540 solution | 88 g |
| Triacrylate of ethoxylated trimethylolpropane | 2.9 g |
| Ebecryl 870 (Hexafunctional polyester acrylate, ex UCB) | 9.1 g |
| Isopropylthioxanthone (photoinitiator) | 1.0 g |
| N-Methyldiethanolamine | 0.44 g |
| Imperon Violet KB (pigment paste ex Hoechst AG) | 0.3 g |
| Ethoxylated acetylenic glycol (surfactant) | 0.2 g |

The acrylates and the photoinitiator were thoroughly mixed and added to the acetalized Airvol 540 solution with stirring, followed by the other ingredients.

The composition was coated front and back on to a white polyester mesh having 120 threads per centimetre stretched over a frame. The coating was dried at 40° C. and exposed 50 light units on a NuArc FT26V3UP Platemaker under a film positive, and then developed in cold water. A satisfactory stencil was produced.

EXAMPLE 5 (Comparison)

A solution of Airvol 540 (9.75 parts) was produced in a mixture of water (75 parts) and N-methylpyrrolidone (3.75 parts). This solution was then used in the following composition:

| | |
|---|---|
| Airvol 540 solution | 88 g |
| Triacrylate of ethoxylated trimethylolpropane | 2.9 g |
| Ebecryl 870 | 19.1 g |
| Isopropylthioxanthone | 1.0 g |
| N-Methyldiethanolamine | 0.44 g |
| Imperon Violet KB | 0.3 g |
| Ethoxylated acetylenic glycol (surfactant) | 0.2 g |

The method of mixing was the same as was used in Example 4.

The composition was then used to form a stencil as described in Example 4. However, the stencil was washed away in the process.

EXAMPLE 6

The following were stirred together at room temperature under a yellow safelight:

| | |
|---|---|
| 92% Hydrolysed polyvinyl alcohol solution (Mowiol 30–92, ex Hoechst AG - 13% in water) | 90 g |
| 4-(4-Formylphenylethenyl)-1-methylpyridinium methosulfate (SbQ salt) | 0.47 g |
| 4-(2-Acryloyloxyethoxy)benzaldehyde (dissolved in N-methyipyrrolidone | 1 g 5 g) |
| Surfactant (polyethoxylated nonylphenol) | 0.22 g |
| 4-Toluene sulfonic acid monohydrate (dissolved in Water | 0.5 g 10 g) |

When homogeneous, the mixture was left to stand for 18 hours and then stirred with:

| | |
|---|---|
| 2% Sodium hydroxide | 5 g |
| Imperon Violet KB | 0.24 g |
| Ebecryl 870 (mixed with Benzil dimethyl ketal (photoinitiator) | 12.1 g 0.4 g) |

The mixture was coated front and back on to a white polyester mesh having 120 threads per centimetre stretched on a frame. After drying at 40° C. it was exposed 20 light units under a film positive on a NuArc Platemaker, and then developed by spraying with water. A good stencil was obtained. This Example illustrates the use of two different cross-linkable groups grafted to polyvinyl alcohol.

EXAMPLE 7 (Comparison)

A screen mesh coating composition was produced as described in Example 6 but omitting the 4-(2-acryloyloxyethoxy)benzaldehyde. It was coated on to a screen, dried, exposed and developed in a similar manner to that described in Example 6. The stencil produced was similar to that of Example 6, but less resistant to rubbing in water.

EXAMPLE 8

A solution of polyvinyl alcohol (88% hydrolysed, degree of polymerization 1450-25.2 parts) in water (148 parts) was acetalized with a solution of 4-(2-acryloyloxyethoxy) benzaldehyde (2.52 parts) in N-methylpyrrolidone (12.6 parts) using 4-toluenesulfonic acid (1.4 parts) as described in Example 2. After neutralization, the solution was used in the following composition:

| | |
|---|---|
| Acetalized polyvinyl alcohol solution | 72 g |
| Imperon Violet KB | 0.12 g |
| Copolymerized ethylene/vinyl acetate emulsion (Mowilith DM104, ex Hoechst AG) | 16 g |
| N-Methyldiethanolamine | 0.54 g |
| Ebecryl 870 (mixed with Benzil dimethyl ketal | 10.7 g 0.32 g) |

The composition was coated on to a screen mesh, dried and exposed for 40 light units as described for Example 4. It gave a satisfactory stencil on developing with water.

EXAMPLE 9

Into a mixture made as in Example 6 (66.7 g) were added, with stirring, 12.8 g of Vinamul 8440 (a polyvinyl acetate emulsion, ex Vinamul Ltd). The product was coated on to a screen mesh, dried and exposed as described in Example 6 to give a good stencil after development in cold water.

EXAMPLE 10

The following mixture was made by the method described in Example 4:

| | |
|---|---|
| Acetalized Airvol 540 solution | 82.5 g |
| Imperon Violet KB | 0.22 g |
| Acrylated urethane prepolymer dissolved in tripropylene glycol diacrylate (Actilane 210TP30, ex Akcros Chemicals PLC) (mixed with Benzophenone | 16.5 g 1.06 g) |
| Mowilith DM 104 | 13 g |
| N-Methyldiethanolamine | 0.53 g |

The composition was coated on to a stencil screen, dried and exposed as described for Example 4. The duration of the exposure was 40 light units. The coating gave a stencil when developed in water.

EXAMPLE 11

0.5% by weight of a powdery diazo resin sensitizer (FNO, from Materiali Sensibili) was added, with stirring, to a portion of the mixture produced as described in Example 10.

A stencil produced as described in Example 10 was faster curing and more water resistant than the screen of Example 10.

EXAMPLE 12

To the composition of Example 6 was added 0.4% by weight of a powdery diazo resin sensitizer (FNO, from Materiali Sensibili). The mixture was coated on to a stencil screen, dried and exposed as described for the composition of Example 6. The rate of curing of the coating, as measured by a step-wedge, was faster than that of Example 6, and the quality of the stencil was good.

EXAMPLE 13

The acetalized polyvinyl alcohol solution described in Example 8 was used in the following mixture:

| | |
|---|---|
| Acetalized polyvinyl alcohol solution | 75 g |
| Imperon Violet | 0.12 g |
| Polyvinyl alcohol solution modified with pendant styrylpyridinium groups (SPP H-13, | 10 g |

-continued

| | |
|---|---|
| ex Toyo Gosei, Tokyo, Japan) | |
| N-Methyldiethanolamine | 0.44 g |
| Ebecryl 870 | 10.7 g |
| (mixed with Benzil dimethyl ketal | 0.32 g) |

The mixture was coated on to a stencil mesh, dried and exposed as described for the composition of Example 6. It gave a satisfactory stencil.

EXAMPLE 14

The following ingredients were mixed and stirred under a safe-light until homogeneous, and the mixture was then left for 18 hours:

| | |
|---|---|
| Unitika UP240G solution (88% hydrolysed polyvinyl alcohol, 13% in water, ex Whyte Chemicals Ltd) | 100 g |
| 4-(2-Acryloyloxyethoxy)benzaldehyde (in N-methylpyrrolidone | 1.3 g 6.5 g) |
| 1-(3-Ethoxycarbonylpropyl)-4-[2-(4'-formyl-phenyl)ethenyl]pyridinium bromide | 0.65 g 0.65 g |
| 4-Toluene sulfonic acid monohydrate (in Water | 0.6 g 23.4 g) |
| Imperon Violet KB | 0.35 g |

The mixture was restirred, and to it was added the following mixture:

| | |
|---|---|
| Acrylate ester of ethoxylated trimethylol propane (Actilan 430, ex Akcros) | 2.25 g |
| Polyethylene glycol 400 | 2.25 g |
| 2-Benzyl-2-dimethylamino-1-(4-morpholino-phenyl)1-butanone | 0.25 g |
| Ethyl 4-dimethylaminobenzoate | 0.25 g |
| 4-Methoxyphenol | 0.01 g | followed after 18 hours by

2% aqueous sodium hydroxide 6 g

The resulting composition was coated on to a stencil mesh, dried and exposed as described for the composition of Example 4, except that the duration of the exposure was 20 light units. On development with cold water a good stencil was obtained which was more resistant to prolonged spraying than was that of Example 4. The speed of the coating, measured by the steps on a Stouffer sensitivity guide, was 6/7.

EXAMPLE 15

4-(2-Acryloyloxyethoxy)benzaldehyde (0.4 parts in N-methyl pyrrolidinone, 4 parts) was stirred into a 6% w/w aqueous solution of hydroxypropyl cellulose (100 parts). After the mixture had been stirred for 1 hour, 4-toluene sulfonic acid (1 part) in water (5 parts) was added, and the mixture was then stirred for a further 4 hours. The mixture was left to stand overnight before neutralization with a 5% aqueous solution of sodium hydroxide (5 parts).

EXAMPLE 16

2-Hydroxybenzaldehyde (33.3 parts) was dissolved in a solution of sodium hydroxide (12.25 parts) in water (120 parts) containing sodium iodide (0.3 parts) using a mechanical stirrer.

A mixture of 2-chloroethanol (20 parts) and water (50 parts) was then added dropwise to the solution whilst stirring was continued. The temperature of the mixture was raised to boiling under a reflux condenser, and it was stirred and heated for seven hours.

The mixture was left to cool over night. Aqueous sodium hydroxide solution was added to pH 13, and the resulting mixture was extracted with four successive portions (100 parts) of ethyl acetate. The extracts were combined, washed with four successive amounts of saturated aqueous sodium chloride (100 parts each), and then dried over anhydrous magnesium sulfate.

The magnesium sulfate was filtered off, and the filtrate was evaporated under reduced pressure to leave 2-(2-formylphenoxy)-ethanol (24.5 parts) as a pale brown oil which crystallized on being left to stand in a refrigerator.

The resulting 2-(2-formylphenoxy)ethanol (24.5 parts) was dissolved in tetrahydrofuran (250 parts) and stirred in a flask fitted with a drying tube and cooled in ice. Triethylamine (30 parts) was added, followed by a solution of acryloyl chloride (18 parts) in tetrahydrofuran (30 parts) which was added dropwise over one hour. The mixture was stirred at room temperature for 24 hours, and water (300 parts) was then added.

The mixture was extracted with three portions of dichloromethane (each 100 parts), and the combined extracts were washed successively with water (100 parts), saturated aqueous sodium hydrogen carbonate solution (100 parts), and water (100 parts).

The extracts were then dried over anhydrous magnesium sulfate, after which they were evaporated under reduced pressure to leave 2-(2-formylphenoxy)ethyl acrylate (12.39 parts) as an off-white solid.

EXAMPLE 17

3-Hydroxybenzaldehyde (29.3 parts) was dissolved in a solution of sodium hydroxide (12.2 parts) in water (120 parts) containing sodium iodide (0.3 parts) using a mechanical stirrer.

A mixture of 2-chloroethanol (18 parts) and water (50 parts) was then added dropwise to the solution whilst stirring was continued. The temperature of the mixture was raised to boiling under a reflux condenser, and it was stirred and heated for seven hours.

The mixture was left to cool over night. Aqueous sodium hydroxide solution was added to pH 13, and the resulting mixture was extracted with four successive portions (100 parts) of ethyl acetate. The extracts were combined, washed with four successive amounts of saturated aqueous sodium chloride (100 parts each), and then dried over anhydrous magnesium sulfate.

The magnesium sulfate was filtered off, and the filtrate was evaporated under reduced pressure to leave 2-(3-formylphenoxy)-ethanol (26.3 parts) as a pale brown oil.

This oily 2-(3-formylphenoxy)ethanol was dissolved in ethyl acetate (400 parts) and stirred in a flask fitted with a drying tube and cooled in ice. Triethylamine (32 parts) was added, followed by a solution of acryloyl chloride (20 parts) in ethyl acetate (30 parts) which was added dropwise over one hour. The mixture was stirred at room temperature for 24 hours, and water (300 parts) was then added.

The aqueous layer was separated and then extracted with three portions of ethyl acetate (each 200 parts). The combined extracts and the original ethyl acetate layer were combined and then washed successively with saturated aqueous sodium chloride solution (100 parts), and three successive portions of water (each 100 parts), saturated aqueous sodium hydrogen carbonate (100 parts) and water (100 parts).

The extracts were then dried over anhydrous magnesium sulfate, after which they were evaporated under reduced pressure to leave 2-(3-formylphenoxy)ethyl acrylate (25.2 parts) as a brown oil.

EXAMPLE 18

4-Hydroxybenzaldehyde (28.9 parts) was dissolved, with mechanical stirring, in a solution of sodium hydroxide (10.6 parts) in water (106 parts), arid 3-chloropropanol (22.1 parts) was then added with continued stirring. The mixture was heated to 115° C. and maintained at this temperature for 20 hours after which the mixture was allowed to cool to room temperature.

A 10% wow aqueous sodium hydroxide solution (75 parts) was added, and the mixture was extracted with two successive portions of ethyl acetate (each 200 parts). The extracts were combined and washed with two successive portions of saturated sodium chloride solution (each 100 parts), following which the extracts were dried over anhydrous sodium sulfate solution and filtered.

The filtrate was evaporated under reduced pressure to leave an oil (27.9 parts). Crystallization of the oil by dissolving it in the minimum amount of toluene at 70° C. and then adding an equal volume of hexane at 70° C. prior to cooling to below 5° C. gave white crystals of 3-(4-formylphenoxy)propanol.

The 3-(4-formylphenoxy)propanol produced (24.3 parts) was dissolved in tetrahydrofuran (200 parts) and stirred in a flask which was cooled in ice and was fitted with a drying tube.

Triethylamine (28.2 parts) was added, followed by a solution of acryloyl chloride (16.5 parts) in tetrahydrofuran (50 parts) which was added dropwise over a period of two hours. The reaction mixture was then stirred at room temperature for 20 hours.

Water (100 parts) was added, and the mixture was extracted with two successive portions of dichloromethane (each 100 parts). The extracts were combined and washed successively with water (100 parts), saturated sodium hydrogen carbonate solution (100 parts) and water (100 parts). Thereafter they were dried over anhydrous magnesium sulfate, the drying agent was filtered off, and the extracts were evaporated under reduced pressure to leave 3-(4-formylphenoxy)propyl acrylate as a brown oil which solidified on refrigeration.

EXAMPLE 19

4-Hydroxybenzaldehyde (24 parts) was dissolved, with mechanical stirring, in a solution of sodium hydroxide (8.6 parts) in water (87 parts), and 6-chlorohexanol (29.3 parts) were then added with continued stirring. The mixture was heated to 115° C. and maintained at this temperature for 20 hours after which the mixture was allowed to cool to room temperature.

A 10% w/w aqueous sodium hydroxide solution (75 parts) was added, and the mixture was extracted with two successive portions of ethyl acetate (each 200 parts). The extracts were combined and washed with two successive portions of saturated sodium chloride solution (each 100 parts), following which the extracts were dried over anhydrous sodium sulfate solution and filtered.

The filtrate was evaporated under reduced pressure to leave an oil which became a wet solid (27.5 parts). This solid was stirred in hexane (100 parts) for 1 hour, filtered, and air dried to give 6-(4-formylphenoxy)hexanol as a greenish-brown solid.

The crude 6-(4-formylphenoxy)hexanol (20 parts) was dissolved in tetrahydrofuran (200 parts) and stirred in a flask which was cooled in ice and was fitted with a drying tube.

Triethylamine (18.8 parts) was added, followed by a solution of acryloyl chloride (11 parts) in tetrahydrofuran (50 parts) which was added dropwise over a period of two hours. The reaction mixture was then stirred at room temperature for 20 hours.

Water (100 parts) was added, and the mixture was extracted with two successive portions of dichloromethane (each 100 parts). The extracts were combined and washed successively with water (100 parts), saturated sodium hydrogen carbonate solution (100 parts) and water (100 parts). Thereafter they were dried over anhydrous magnesium sulfate, the drying agent was filtered off, and the extracts were evaporated under reduced pressure to leave a brown oil which solidified when stored below 5° C. The solid 6-(4-formylphenoxy)hexyl acrylate produced was triturated and washed with hexane (100 parts), filtered and air dried (4.9 parts).

EXAMPLE 20

4-Hydroxybenzaldehyde (32.7 parts) was dissolved, with mechanical stirring, in a solution of sodium hydroxide (12 parts) in water (120 parts), and 2-(2-chloroethoxy)ethanol (31.7 parts) were then added with continued stirring. The mixture was heated to 115° C. and maintained at this temperature for 20 hours after which the mixture was allowed to cool to room temperature.

A 10% w/w aqueous sodium hydroxide solution (75 parts) was added, and the mixture was extracted with two successive portions of ethyl acetate (each 200 parts). The extracts were combined and washed with two successive portions of saturated sodium chloride solution (each 100 parts), following which the extracts were dried over anhydrous sodium sulfate solution and filtered.

The filtrate was evaporated under reduced pressure to leave an oil which formed a yellow solid when cooled below 5° C. (27.5 parts). This solid was triturated and washed with hexane (100 parts), the resulting 2-[2-(4-formyl phenoxy)ethoxy]ethanol (38.5 parts) remaining as a yellow solid which was filtered off and air dried.

The 2-[2-(4-formylphenoxy)ethoxy]ethanol produced as above (20 parts) was dissolved in tetrahydrofuran (200 parts) and stirred in a flask which was cooled in ice and was fitted with a drying tube.

Triethylamine (50 parts) was added, followed by a solution of acryloyl chloride (11.6 parts) in tetrahydrofuran (50 parts) which was added dropwise over a period of two hours. The reaction mixture was then stirred at room temperature for 20 hours.

Water (100 parts) was added, and the mixture was extracted with two successive portions of dichloromethane (each 100 parts). The extracts were combined and washed successively with water (100 parts), saturated sodium hydrogen carbonate solution (100 parts) and water (100 parts). Thereafter they were dried over anhydrous magnesium sulfate, the drying agent was filtered off, and the extracts were evaporated under reduced pressure to leave an oil which formed a pale yellow solid on storage below 5° C. This solid was recrystallized as described in Example 19 to yield pale yellow solid 2-[2-(4-formylphenoxy)ethoxy]ethyl acrylate (11 parts).

EXAMPLE 21

4-Hydroxybenzaldehyde (19.4 parts) was dissolved, with mechanical stirring, in a solution of sodium hydroxide (7.1 parts) in water (72 parts), and 2-[2-(2-chloroethoxy)ethoxy]-ethanol (21.8 parts) were then added with continued stirring. The mixture was heated to 120° C. and maintained at this temperature for 20 hours after which the mixture was allowed to cool to room temperature.

A 10% w/w aqueous sodium hydroxide solution (75 parts) was added, and the mixture was extracted with two successive portions of ethyl acetate (each 200 parts). The extracts were combined and washed with two successive portions of saturated sodium chloride solution (each 100 parts), following which the extracts were dried over anhydrous sodium sulfate solution and filtered.

The filtrate was evaporated under reduced pressure to leave 2-{2-[2-(4-formylphenoxy)ethoxy]ethoxy}ethanol as a dark oil (20.9 parts).

This oil produced as above (20 parts) was dissolved in tetrahydrofuran (200 parts) and stirred in a flask which was cooled in ice and was fitted with a drying tube.

Triethylamine (16.4 parts) was added, followed by a solution of acryloyl chloride (9.6 parts) in tetrahydrofuran (50 parts) which was added dropwise over a period of two hours. The reaction mixture was then stirred at room temperature for 20 hours.

Water (100 parts) was added, and the mixture was extracted with two successive portions of dichloromethane (each 100 parts). The extracts were combined and washed successively with water (100 parts), saturated sodium hydrogen carbonate solution (100 parts) and water (100 parts). Thereafter they were dried over anhydrous magnesium sulfate, the drying agent was filtered off, and the extracts were evaporated under reduced pressure to leave 2-{2-[2-(4-formylphenoxy)ethoxy]ethoxy}ethyl acrylate as a brown oil (8.4 parts).

EXAMPLE 22

2,4-Dihydroxybenzaldehyde (12 parts) was dissolved, with mechanical stirring, in a solution of sodium hydroxide (7.8 parts) in water (80 parts), and 2-chloroethanol (13.1 parts) were then added with continued stirring. The mixture was heated to 115° C. and maintained at this temperature for 20 hours after which the mixture was allowed to cool to room temperature.

A 10% w/w aqueous sodium hydroxide solution (75 parts) was added, and the mixture was extracted with two successive portions of ethyl acetate (each 200 parts). The extracts were combined and washed with two successive portions of saturated sodium chloride solution (each 100 parts), following which the extracts were dried over anhydrous sodium sulfate solution and filtered.

The filtrate was evaporated under reduced pressure to leave 2,4-bis-(2-hydroxyethoxy)benzaldehyde as a yellow solid which was recrystallized from a 1:3 v/v mixture of methanol and chloroform from which it was filtered off and air dried (yield 0.4 parts).

This product (0.3 parts) was dissolved in tetrahydrofuran (45 parts) and stirred in a flask which was cooled in ice and was fifted with a drying tube.

Triethylamine (0.55 parts) was added, followed by a solution of acryloyl chloride (0.32 parts) in tetrahydrofuran (5 parts) which was added dropwise over a period of two hours. The reaction mixture was then stirred at room temperature for 20 hours.

Water (25 parts) was added, and the mixture was extracted with two successive portions of dichloromethane (each 25 parts). The extracts were combined and washed successively with water (25 parts), saturated sodium hydrogen carbonate solution (25 parts) and water (25 parts). Thereafter they were dried over anhydrous magnesium sulfate, the drying agent was filtered off, and the extracts were evaporated under reduced pressure to leave 2,4-bis-(2-acryloyloxyethoxy)benzaldehyde as a greenish oil (0.3 parts).

EXAMPLE 23

4-Formylphenoxyacetic acid (5 parts) was heated for 90 minutes under reflux with thionyl chloride (25 parts) in a flask fitted with an anhydrous calcium chloride filled drying tube. The resultant red colored solution was evaporated under reduced pressure to give a red colored oil which was distilled at 120° C. and 0.4 mm Hg pressure to yield 4-(dichloromethyl)phenoxyacetyl chloride (1.2 parts).

This acid chloride (1.2 parts) was dissolved in tetrahydrofuran, and a solution of hydroxyethyl acrylate (0.6 parts) and triethylamine (0.6 parts) in tetrahydrofuran (25 parts) was added dropwise to the solution with stirring.

After stirring the mixture for a further 3 hours, water (20 parts) was added and the resulting solution was stirred for 27 hours, the solution was extracted with two portions of ethyl acetate (each 25 parts), and the combined extracts were distilled under reduced pressure to yield 2-(4-formylphenoxyacetyloxy)ethyl acrylate (1 part) as a red oil which formed a paste on standing.

EXAMPLE 24

4-Carboxybenzaldehyde (10 parts) was stirred with ethylene glycol (30 parts), 4-toluene sulfonic acid monohydrate (0.2 parts) and toluene (200 parts). The mixture was heated under reflux for 18.5 hours in a flask fitted with a Dean and Stark trap, and the mixture was allowed to cool. The resultant pale yellow solution was washed with a 5% w/w aqueous sodium carbonate solution (200 parts). The aqueous layer was then extracted twice with dichloromethane (each 100 parts), the extracts were combined, and the solvent was removed under reduced pressure to yield crude product (1.7 parts), and removal of the toluene from the organic layer yielded a pale yellow solid (11 parts) which was recrystallized from diethyl ether using an ice bath at −7° C., to give 2-4'-(2-hydroxyethoxy-carbonyl)phenyl dioxolane as a white solid.

The recrystallized product (3 parts) and triethylamine (1.5 parts) were stirred into tetrahydrofuran (30 parts). A solution of acryloyl chloride (1.5 parts) in tetrahydrofuran (20 parts) was then added dropwise to the mixture to produce a viscous solution.

The mixture was left to stand for two hours and then diluted with dichloromethane (50 parts), after which it was stirred for 16 hours.

Water (100 parts) was then stirred into the dispersion to produce two layers, both of which being clear solutions. The aqueous layer was washed twice with dichloromethane (each 50 parts), and the combined extracts were then evaporated under reduced pressure to leave a yellow oil (1.9 parts). The yellow oil was stirred for 24 hours in acidified water (pH 1,100 parts). Thereafter, the mixture was extracted twice with dichloromethane, the extracts were combined, and the combined extracts were evaporated under reduced pressure to yield 2-acryloyloxyethyl 4-formylbenzoate (1.1 parts).

EXAMPLE 25

Ethylene glycol (20 parts) was acidified with four drops of concentrated hydrochloric acid and stirred whilst freshly distilled crotonaldehyde (5 parts) was added slowly with a syringe. The mixture was stirred overnight, sealed, and allowed to stand for four days.

5% Aqueous sodium carbonate solution (25 parts) was added, and the mixture was extracted twice with dichloromethane (each 25 parts). The solvent extracts were combined and thereafter evaporated under reduced pressure to yield an amber oil which was distilled at 2 torr and 96–100° C. to yield 2-(2'-hydroxy-ethoxy)propyl-1,3-dioxolane as a pale yellow oil (2.9 parts).

The oil (2.5 parts) and triethylamine (2 parts) were dissolved in dichloromethane (25 parts), following which a solution of acryloyl chloride (2 parts) in dichloromethane (25 parts) was added dropwise with stirring. A 5% aqueous sodium carbonate solution (50 parts) was added, and the aqueous layer was then extracted twice with dichloromethane (each 50 parts). The organic extracts were combined and then evaporated under reduced pressure to yield 2-(2'-acryloxyethoxy)propyl-1,3-dioxolane as a reddish brown oil (2.9 parts).

EXAMPLE 26

Ethylene glycol (8 parts) was acidified with four drops of concentrated hydrochloric acid and stirred whilst acroiein (2 parts) was added slowly from a syringe. The mixture was stirred overnight, after which a 5% aqueous sodium carbonate solution (10 parts) was added, and greenish solution which was produced was extracted twice with dichloromethane (5 parts).

The organic extracts were combined, and the solvent was removed under reduced pressure to yield 2-(2'hydroxyethoxy)ethyl-1,3-dioxolane as a clear oil (2 parts).

The oil (3 parts) was dissolved in dichloromethane (25 parts) to which triethylamine (3 parts) was then added. A solution of acryloyl chloride (3 parts) was added dropwise to the stirred solution which was then stirred overnight.

A 5% aqueous solution of sodium carbonate (30 parts) was stirred into the mixture, resulting in the formation of two layers. The organic layer was evaporated under reduced pressure to yield a clear liquid. Short-path distillation of this liquid at 60° C. under reduced pressure removed a clear liquid impurity to leave the desired 2-(2'-acryoloxyethoxy) ethyl-1,3-dioxolane (2.5 parts).

EXAMPLE 27

The acrylate esters produced in Examples 16 to 26 are respectively reacted with polyvinyl alcohol as described in Example 2 to produce grafted polyvinyl alcohols. The grafted polyvinyl alcohols are then formulated as described in Example 3 and used to form screen stencils.

We claim:

1. A screen printing stencil made from a composition comprising polyhydroxy compounds having a plurality of 1,2- or 1,3-diol groups along a polymer backbone, the diol groups having grafted thereto a compound of formula I below (I)

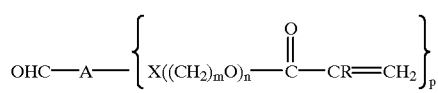

(where A is an arylene or an alkylene group;
X is an oxygen atom, a sulfur atom, a carbon—carbon bond,
or a group of formula

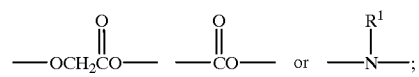

R is a hydrogen atom or a methyl group;
$R^1$ is a ($C_1$–$C_4$) alkyl group;
m is an integer of from 1 to 8;
n is an integer of from 1 to 3; and
p is 1 or 2);
or an acetal of the polyhydroxy compound with ethylene glycol.

2. The screen printing stencil according to claim 1, wherein A represents a benzene ring.

3. The screen printing stencil according to claim 2, wherein the benzene ring has the indicated substituents in the 1- and 4-positions thereof.

4. The screen printing stencil according to claim 1, wherein A represents a group of formula —$CH_2CH(CH_3)$—.

5. The screen printing stencil according to claim 1, wherein $R^1$ represents a methyl group.

6. The screen printing stencil according to claim 1, wherein the polyhydroxy compound is polyvinyl alcohol, cellulose or a hydroxyalkyl derivative of cellulose.

7. The screen printing stencil according to claim 6, wherein the hydroxyalkyl derivative of cellulose is hydroxy ethyl cellulose, hydroxypropyl cellulose, or ethylhydroxyethyl cellulose.

8. The screen printing stencil according to claim 1, wherein the composition further comprises a free radical photoinitiator or a photochemical crosslinking agent.

9. The screen printing stencil according to claim 1, wherein the composition comprises up to 50 percent by weight of the grafted polyhydroxy compound.

10. The screen printing stencil according to claim 6, wherein up to 20 per cent of the hydroxy groups of the polyvinyl alcohol have a compound of formula I grafted thereto.

11. The screen printing stencil according to claim 6, wherein the polyvinyl alcohol is derived from polyvinyl acetate with a degree of hydrolysis of from 72 to 99 percent.

12. The screen printing stencil according to claim 10, wherein the grafted polyvinyl alcohol is water soluble.

13. The screen printing stencil according to claim 10, wherein the composition further includes a solubilizer for the grafted polyvinyl alcohol.

14. The screen printing stencil according to claim 8, wherein the photoinitiator comprises a thioxanthone, an acetophenone derivative, benzophenone, an acyl phosphine oxide or a benzil derivative.

15. The screen printing stencil according to claim 1, the composition further including a filler.

16. The screen printing stencil according to claim 1, the composition further including an unsaturated polymerizable material.

17. The screen printing stencil according to claim 11, wherein the grafted polyvinyl alcohol is water soluble.

18. The screen printing stencil according to claim 11, wherein the composition further includes a solubilizer for the grafted polyvinyl alcohol.

* * * * *